United States Patent
Chien et al.

(10) Patent No.: US 10,515,807 B1
(45) Date of Patent: Dec. 24, 2019

(54) METHODS OF FABRICATING SEMICONDUCTOR DEVICES WITH METAL-GATE WORK-FUNCTION TUNING LAYERS

(71) Applicant: Taiwan Semiconductor Manufacturing Co., Ltd., Hsinchu (TW)

(72) Inventors: Jui-Fen Chien, Taichung (TW); Chih-Hsiang Fan, Hsinchu (TW); Hsiao-Kuan Wei, Longtan Township, Taoyuan County (TW); Pohan Kung, Tainan (TW); Hsien-Ming Lee, Changhua (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/008,321

(22) Filed: Jun. 14, 2018

(51) Int. Cl.
| | | |
|---|---|---|
| *H01L 21/28* | (2006.01) | |
| *H01L 29/49* | (2006.01) | |
| *H01L 29/66* | (2006.01) | |
| *H01L 21/321* | (2006.01) | |
| *H01L 29/06* | (2006.01) | |

(52) U.S. Cl.
CPC .... *H01L 21/28088* (2013.01); *H01L 21/3212* (2013.01); *H01L 29/4966* (2013.01); *H01L 29/6681* (2013.01); *H01L 29/66545* (2013.01); *H01L 29/0649* (2013.01)

(58) Field of Classification Search
CPC ......... H01L 21/28088; H01L 21/3212; H01L 29/66545; H01L 29/4966; H01L 29/6681; H01L 29/0649

USPC ........ 438/589, 591, 592, 595; 257/288, 369, 257/392, 401, 412, E21.195, E21.409, 257/E21.599, E29.255
See application file for complete search history.

(56) References Cited

U.S. PATENT DOCUMENTS

| | | | | |
|---|---|---|---|---|
| 2012/0329261 | A1* | 12/2012 | Wang | H01L 21/265 438/589 |
| 2015/0061042 | A1* | 3/2015 | Cheng | H01L 29/4966 257/412 |
| 2015/0221743 | A1* | 8/2015 | Ho | H01L 29/4966 257/392 |
| 2015/0380407 | A1* | 12/2015 | Ji | H01L 27/0922 257/369 |
| 2015/0380409 | A1* | 12/2015 | Togo | H01L 27/0924 257/369 |

(Continued)

OTHER PUBLICATIONS

U.S. Appl. No. 15/824,474, filed Nov. 28, 2017, Wei et al.

*Primary Examiner* — Dao H Nguyen
(74) *Attorney, Agent, or Firm* — Birch, Stewart, Kolasch & Birch, LLP

(57) ABSTRACT

Methods of fabricating semiconductor devices are provided. The method includes forming a gate dielectric layer over a substrate. The method also includes depositing a first p-type work function tuning layer over the gate dielectric layer using a first atomic layer deposition (ALD) process with an inorganic precursor. The method further includes forming a second p-type work function tuning layer on the first p-type work function tuning layer using a second atomic layer deposition (ALD) process with an organic precursor. In addition, the method includes forming an n-type work function metal layer over the second p-type work function tuning layer.

20 Claims, 9 Drawing Sheets

(56) References Cited

U.S. PATENT DOCUMENTS

2016/0225868 A1* 8/2016 Kim .................... H01L 29/4966
2017/0032972 A1* 2/2017 Tsai ..................... H01L 21/321
2017/0125298 A1* 5/2017 Jangjian ............ H01L 21/82345
2018/0323303 A1* 11/2018 Liu ..................... H01L 29/4966

* cited by examiner

METHODS OF FABRICATING SEMICONDUCTOR DEVICES WITH METAL-GATE WORK-FUNCTION TUNING LAYERS

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers over a semiconductor substrate, and patterning the various material layers using lithography to form circuit components and elements thereon.

The semiconductor integrated circuit (IC) industry has experienced exponential growth. Technological advances in IC materials and design have produced generations of ICs where each generation has smaller and more complex circuits than the previous generation. As the semiconductor IC industry has progressed into nanometer process nodes in pursuit of higher device density, higher performance, and lower costs, challenges from both fabrication and design issues have resulted in the development of three-dimensional designs, such as a Fin Field Effect Transistor (FinFET). FinFET devices typically include semiconductor fins with high aspect ratios and in which channel and source/drain regions are formed. A gate is formed over and along the sides of the fin structure (e.g., wrapping) utilizing the advantage of the increased surface area of the channel to produce faster, more reliable, and better-controlled semiconductor transistor devices. However, miniaturization has led to challenges that may not have been presented by previous generations at larger sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
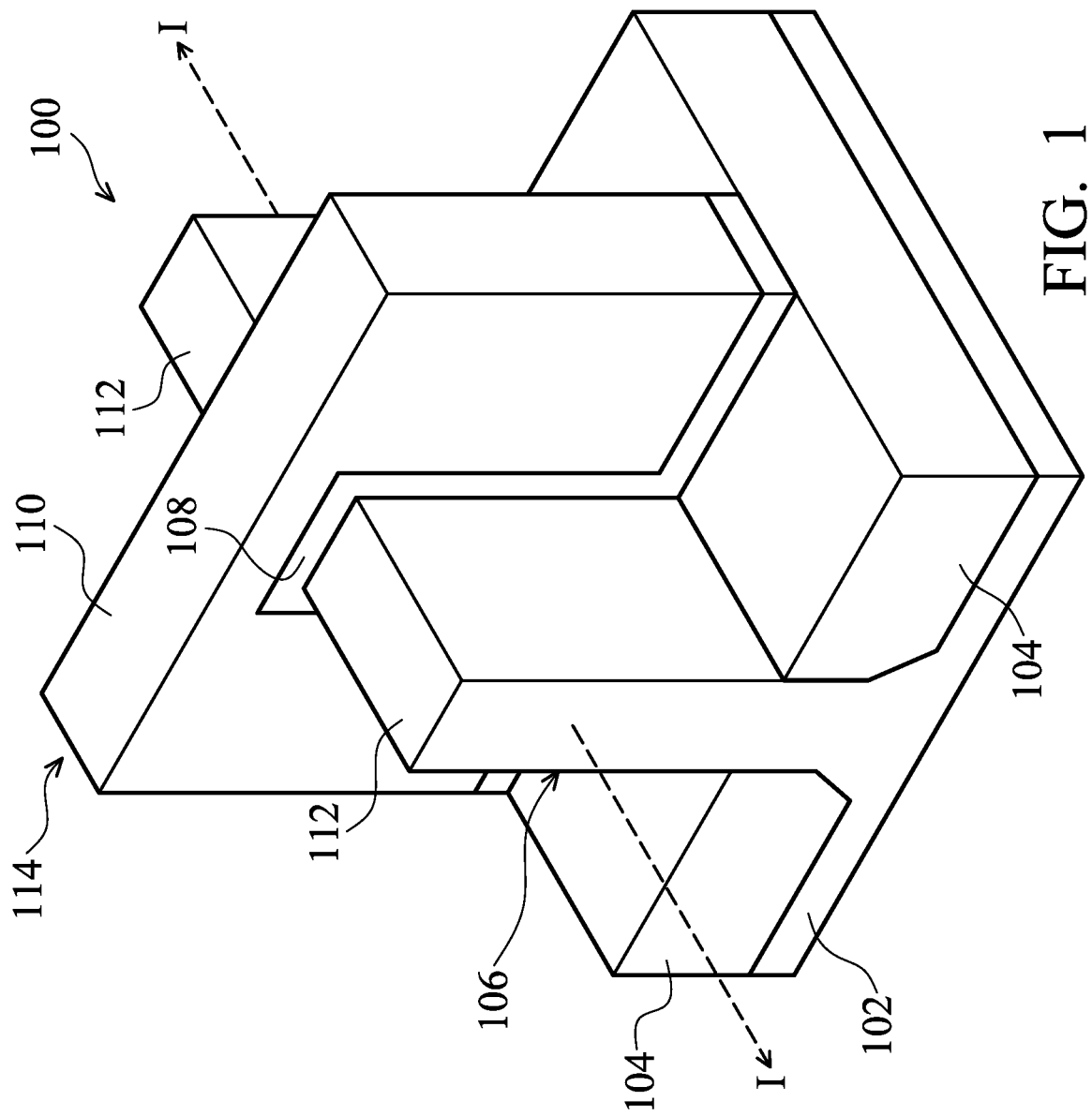
FIG. 1 shows a perspective view of a semiconductor device, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional blocks can be provided before, during, and after the method, and some of the blocks described can be replaced or eliminated for other embodiments of the method.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Embodiments disclosed herein relate generally to fabricating semiconductor devices for metal-gate work-function tuning. In some embodiments, the semiconductor devices are p-type Field Effect Transistor (PFET) devices, such as p-type Fin Field Effect Transistor (FinFET) devices with a high dielectric constant (high-k) gate dielectric layer and a metal gate. One way to modulate the work function of a metal gate close to the valence band edge of Si, which can meet the lower threshold voltage requirements of a p-type Field Effect Transistor (PFET), is to increase the thickness of the titanium nitride (TiN) work function tuning layer of the metal gate. However, as the semiconductor industry has progressed into process nodes of 10 nm and beyond, there is less and less space available for filling the TiN work function tuning layer of the metal gate after the high-k cap layer and the etch stop layer are deposited in the gate-last process.

According to embodiments of the disclosure, the metal gate includes a TiN work function tuning layer that is formed using a carbon-based TiN atomic layer deposition (ALD) process and may be referred to as a carbon-based TiN layer. The carbon-based TiN layer has a positive shift in work function while it is compared with a TiN work function tuning layer of the same thickness formed using a chloride-based TiN ALD process. The TiN work function tuning layer formed in the chloride-based TiN ALD process may be referred to as a chloride-based TiN layer. The carbon-based TiN layer used in the metal gate is favorable to a p-type band-edge metal gate, i.e. close to a valence band-edge metal gate, for PFET boost without increasing the thickness of the TiN work function tuning layer in the PFET devices.

In some embodiments, the metal gate includes several work function tuning layers that include at least one carbon-based TiN layer. In addition, the work function layers of the metal gate also include a chloride-based TiN layer. A combination of the carbon-based TiN layer and the chloride-based TiN layer can achieve metal-gate work-function tuning for multiple threshold voltage (multi-Vt) devices. As a result, multi-Vt devices can be incorporated in the same chip or wafer without increasing the thickness of the work function tuning layers in PFET devices. Accordingly, the embodiments of the disclosure for fabricating semiconductor devices for metal-gate work-function tuning can make it possible to target multi-Vt devices at process nodes of 16 nm, 10 nm, 7 nm and beyond.

The foregoing broadly outlines some aspects of the embodiments described herein. Some embodiments described herein are described in the context of PFET devices, and more particularly, in the context of metal-gate work-function tuning for p-type FinFET devices. Some variations of the exemplary methods and structures are described. A person having ordinary skill in the art will readily understand other modifications may be made that are contemplated within the scope of other embodiments. Although embodiments of the method may be described in a particular order, various other embodiments of the method may be performed in any logical order and may include fewer or more steps than what is described herein.

Embodiments for forming semiconductor devices are provided. The semiconductor device can be a Field Effect Transistor (FET), which may be a FinFET like the one shown in FIG. 1, a planar FET, a Horizontal Gate All Around (HGAA) FET, or another device. FIG. 1 shows a perspective view of a semiconductor device 100 such as a FinFET, in accordance with some embodiments. A substrate 102 is provided, as shown in FIG. 1 in accordance with some embodiments. The substrate 102 may be a bulk semiconductor substrate, a semiconductor-on-insulator (SOI) substrate, or the like, which may be doped (e.g., with a p-type or an n-type dopant) or undoped. Generally, an SOI substrate includes a layer of a semiconductor material formed on an insulation layer. The insulation layer may be a buried oxide (BOX) layer, a silicon oxide layer, or the like. The insulation layer is provided on a silicon or glass substrate. The substrate 102 may be made of silicon or another semiconductor material. For example, the substrate 102 is a silicon wafer. In some examples, the substrate 102 is made of a compound semiconductor such as silicon carbide, gallium arsenic, indium arsenide, or indium phosphide. In some examples, the substrate 102 is made of an alloy semiconductor such as GaAsP, AlInAs, AlGaAs, GaInAs, GaInP, or GaInAsP.

A mask layer (not shown) may be formed over the substrate 102 for forming a number of fins (or fin structures) 106. In some examples, the mask layer may be a single-layered or multi-layered structure. The mask layer may be made of silicon oxide, silicon nitride, silicon oxynitride, silicon carbide, silicon carbon nitride, or a combination thereof. The mask layer may be deposited by chemical vapor deposition (CVD), physical vapor deposition (PVD), a high-density plasma chemical vapor deposition (HDPCVD) process, a spin-on process, a sputtering process, or another deposition process.

A patterned photoresist layer (not shown) is formed over the mask layer for patterning the mask layer. The patterned photoresist layer may be formed in a photolithography process. The photolithography process includes photoresist coating (e.g., spin-on coating), soft baking, mask aligning, exposure, post-exposure baking, developing the photoresist, rinsing and drying (e.g., hard baking).

Next, the mask layer is patterned by using the patterned photoresist layer as a mask in an etching process. The etching process may include a reactive ion etch (RIE), neutral beam etch (NBE), inductive coupled plasma (ICP) etch, or a combination thereof. The etching process may be anisotropic. Subsequently, the patterned photoresist layer is removed in an ashing process or a wet strip process. As a result, a patterned mask layer is obtained.

Afterwards, the substrate 102 is etched to form a number of fins (or fin structures) 106 by using the patterned mask layer as a mask. FIG. 1 shows only one fin 106, for clarity. The patterned mask layer may be referred to as a hard mask. The etching process may include a RIE, NBE, ICP etch, or a combination thereof. The etching process may be anisotropic. A trench is formed between neighboring pairs of fins 106. In addition, the fin 106 protrudes from the substrate 102.

The fin 106 has a top portion and a bottom portion. In some examples, the top portion of the fin 106 may be formed from a Ge-containing layer, such as silicon germanium (SiGe) or germanium (Ge). The bottom portion may be formed from the substrate 102 such as silicon (Si). The portion of the Ge-containing layer directly under a gate structure 114 is used as a channel region. The Ge-containing layer having compressive stress is suitable for providing increased carrier mobility, i.e., increased hole carrier mobility, for the channel region of P-type FET devices (i.e., PMOS devices).

Next, an insulating layer (not shown) for an isolation structure 104 is formed to cover the fins 106 over the substrate 102, and to fill the trench between neighboring pairs of fins 106. In some examples, the insulating layer is made of silicon oxide, silicon nitride, silicon oxynitride, fluoride-doped silicate glass (FSG), or another low-k dielectric material. The insulating layer may be formed using a deposition process, such as a CVD process, a spin-on-glass (SOG) process, or another applicable process.

Next, the insulating layer is recessed to form the isolation structure 104, as shown in FIG. 1. The isolation structure 104 is for example a shallow trench isolation (STI) structure which surrounds the bottom portion of the fin 106, and is disposed between neighboring pairs of fins 106. The insulating layer is recessed and the patterned mask layer is removed in a planarization process and an etching process. The planarization process is for example a chemical mechanical polishing (CMP) process, which exposes the top surface of the patterned mask layer. The patterned mask layer is then removed in a wet etching process that uses a phosphoric acid ($H_3PO_4$) etching solution, for example. Next, the patterned mask layer and a portion of the insulating layer are removed in a dry etching process that uses etching gases. In some examples, the etching gases may include hydrogen fluoride (HF) gas, ammonia ($NH_3$) gas, and dilute gas (such as $N_2$ or Ar). The fin 106 protrudes between the neighboring isolation structures 104, as shown in FIG. 1 in accordance with some embodiments.

As previously stated, the semiconductor device can be a planar FET, a FinFET like the one shown in FIG. 1, a HGAA FET, or another device. In accordance with a FET, a gate structure is formed on an active area of the semiconductor substrate. In a planar FET, the active area can be or include a portion at the top surface of the semiconductor substrate delineated by isolation structures. In a FinFET, the active area can be or include the fin 106 protruding from between the isolation structures 104 on the semiconductor substrate 102, like the one shown in FIG. 1.

The gate structure 114 is formed along sidewalls and over the top surface of the fin 106, and is also formed on the isolation structures 106, as shown in FIG. 1 in accordance with some embodiments. The longitudinal direction of the gate structure 114 is perpendicular to the longitudinal direction of the fin 106. In addition, source and drain regions 112 are formed in the fin 106 at opposite sides of the gate structure 114.

The gate structure 114 may be a dummy gate structure 114 which will be replaced by a real gate structure using a gate-last process. The dummy gate structure 114 includes a dummy gate dielectric layer 108 and a dummy gate electrode layer 110 over the dummy gate dielectric layer 108. The real gate structure may include a high dielectric constant (high-k) gate dielectric layer and a metal gate electrode layer. Details of the materials and processes used in forming the real gate structure will be described below and will refer to the cross-sectional views shown in FIGS. 2A-2L and FIGS. 3A-3C. FIG. 1 illustrates a reference cross-section I-I that is used in FIGS. 2A-2L and FIGS. 3A-3C. Cross-section I-I is in a plane along a channel region in the fin 106 between opposing source/drain regions 112.

Figure 2A:
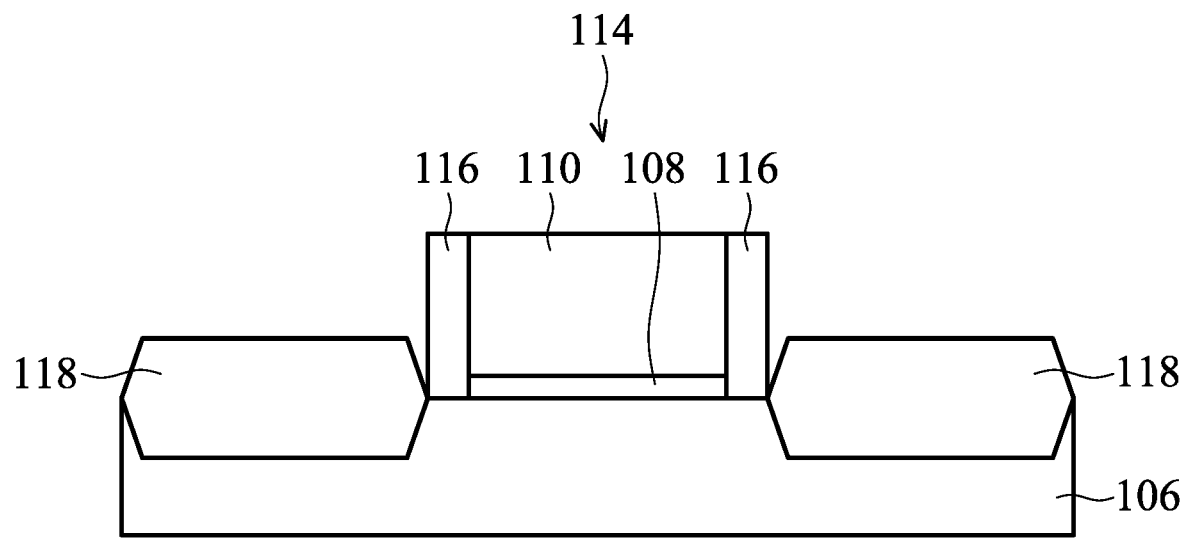
FIGS. 2A-2L show cross-sectional views of respective intermediate structures at various stages of an exemplary method for fabricating a semiconductor device taken along line I-I in FIG. 1, in accordance with some embodiments.

FIGS. 2A-2L show cross-sectional views of respective intermediate structures at various stages of an exemplary method for fabricating a semiconductor device taken along line I-I in FIG. 1, in accordance with some embodiments. The dummy gate dielectric layer 108 and the dummy gate electrode layer 110 of the dummy gate structure 114 are formed on the fin 106, as shown in FIG. 2A in accordance with some embodiments. In some examples, the dummy gate dielectric layer 108 includes dielectric materials, such as silicon oxide, silicon nitride, silicon oxynitride, or a combination thereof. In some examples, the dummy gate electrode layer 110 is made of polysilicon. The dummy gate dielectric layer 108 and the dummy gate electrode layer 110 are formed independently using a deposition process, such as chemical vapor deposition (CVD), physical vapor deposition (PVD), atomic layer deposition (ALD), high density plasma CVD (HDPCVD), metal organic CVD (MOCVD), or plasma enhanced CVD (PECVD).

Then, those deposited layers of the dummy gate dielectric layer 108 and the dummy gate electrode layer 110 are patterned into the dummy gate structure 114, for example, using photolithography and one or more etching processes. For example, a photoresist can be formed on a mask layer (not shown) over the dummy gate electrode layer 110. The photoresist is formed using spin-on coating, and is patterned by exposing the photoresist to light using an appropriate photo mask. Exposed or unexposed portions of the photoresist may then be removed depending on whether a positive or negative photoresist is used. The pattern of the photoresist may then be transferred to the mask layer, the dummy gate electrode layer 110 and the dummy gate dielectric layer 108, such as by using one or more suitable etching processes. The one or more etching processes may include a reactive ion etch (RIE), neutral beam etch (NBE), or a combination thereof. The etching process may be anisotropic. Subsequently, the photoresist is removed in an ashing or wet strip process, for example.

Gate spacers 116 are formed along sidewalls of the dummy gate structure 114 and on the fin 106, as shown in FIG. 2A in accordance with some embodiments. The gate spacers 116 may be formed by conformally depositing one or more layers of the gate spacers 116 and anisotropically etching the one or more layers. The one or more layers deposited for the gate spacers 116 are made of silicon oxide, silicon nitride, silicon oxynitride, silicon carbon nitride, multiple layers thereof, or a combination thereof. The one or more layers deposited for the gate spacers 116 may be deposited by CVD, ALD, or another deposition technique. The etching process can include a RIE, NBE, or another etching process.

In some examples, the source/drain regions 112 are formed in active regions of a semiconductor substrate on opposite sides of the dummy gate structure 114. For example, the source/drain regions 112 may be formed by implanting dopants into the active areas of the semiconductor substrate using the dummy gate structure 114 and the gate spacers 116 as a mask. Hence, the source/drain regions 112 can be formed by implantation on opposite sides of the dummy gate structure 114.

In some embodiments, the fin 106 may be recessed using the dummy gate structure 114 and the gate spacers 116 as a mask, and epitaxial source/drain regions 118 may be epitaxially grown in the recesses, as shown in FIG. 2A in accordance with some embodiments. The recessing can be performed with an etching process. The etching process can be isotropic or anisotropic, or it may be selective with respect to one or more crystalline planes of the material of the fin 106. Hence, the recesses can have various cross-sectional profiles based on the etching process that is implemented. The etching process may be a dry etch, such as a RIE or NBE; or a wet etch, such as using tetramethylammonium hydroxide (TMAH), ammonium hydroxide ($NH_4OH$), or another etchant.

The epitaxial source/drain regions 118 may be made of silicon germanium ($Si_xGe_{1-x}$, where x can be between approximately 0 and 1), silicon carbide, silicon phosphorus, silicon carbon phosphorus, pure germanium, a III-V compound semiconductor, a II-VI compound semiconductor, or the like. Examples of the materials used in the III-V compound semiconductor include InAs, AlAs, GaAs, InP, GaN, InGaAs, InAlAs, GaSb, AlSb, AlP, and GaP. The epitaxial source/drain regions 118 may be formed in the recesses that are in the fin 106 by an epitaxial growth process, such as metal-organic CVD (MOCVD), molecular beam epitaxy (MBE), liquid phase epitaxy (LPE), vapor phase epitaxy (VPE), selective epitaxial growth (SEG), or a combination thereof. The epitaxial source/drain regions 118 may be raised relative to the fin 106, as illustrated. The epitaxial source/drain regions 118 may be doped by in-situ doping during the epitaxial growth and/or by implantation after the epitaxial growth. Hence, the epitaxial source/drain regions 118 can be formed on opposite sides of the dummy gate structure 114. Examples of dopants for the epitaxial source/drain regions 118 (e.g., by in-situ doping or implantation) are boron for a p-type device; or phosphorus or arsenic for an n-type device, although other dopants may be used. The epitaxial source/drain regions 118 may have a dopant concentration in a range from about $10^{19}$ cm$^{-3}$ to about $10^{21}$ cm$^{-3}$.

Figure 2B:
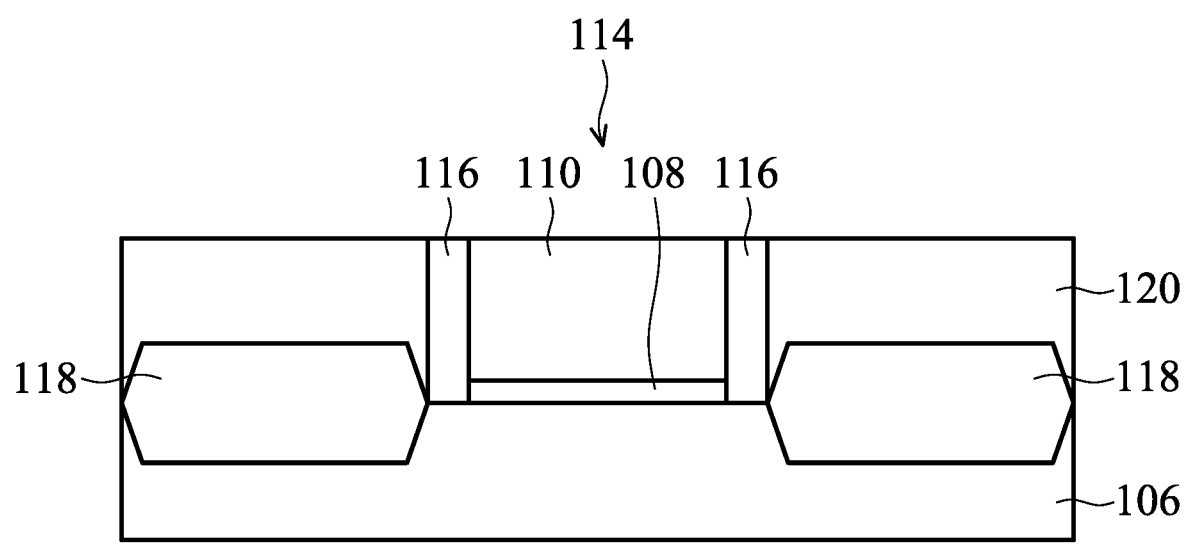

Next, an interlayer dielectric (ILD) layer 120 is formed over the epitaxial source/drain regions 118 and is coplanar with the top surfaces of the gate spacers 116 and the dummy gate structure 114, as shown in FIG. 2B in accordance with some embodiments. The ILD layer 120 may include an etch stop layer (not shown) and a principal dielectric layer. Generally, the etch stop layer can provide a mechanism to stop an etching process when forming contacts for the epitaxial source/drain regions 118. The etch stop layer may be formed of a dielectric material having a different etch selectivity from adjacent layers, for example, the principal dielectric layer of the ILD layer 120.

The ILD layer 120 is deposited over the epitaxial source/drain regions 118, the gate spacers 116 and the dummy gate structure 114. For example, the etch stop layer may be conformally deposited over the epitaxial source/drain regions 118, the gate spacers 116 and the dummy gate structure 114. The etch stop layer of the ILD layer 120 may be silicon nitride, silicon carbon nitride, silicon carbon oxide, carbon nitride, or a combination thereof, and may be deposited by CVD, PECVD, ALD, or another deposition technique. Then, for example, the principal dielectric layer is deposited over the etch stop layer. The principal dielectric layer of the ILD layer 120 may be silicon dioxide, a low-k dielectric material (e.g., a material having a dielectric constant lower than silicon dioxide), such as silicon oxynitride, phosphosilicate glass (PSG), borosilicate glass (BSG), borophosphosilicate glass (BPSG), undoped silicate glass (USG), fluorinated silicate glass (FSG), organosilicate glasses (OSG), SiOxCy, Spin-On-Glass (SOG), Spin-On-Polymers, silicon carbon material, a compound thereof, a composite thereof, or a combination thereof. The principal dielectric layer of the ILD layer 120 may be deposited by spin-on coating, CVD, Flowable CVD (FCVD), PECVD, PVD, or another deposition technique.

The ILD layer 120 can be planarized after being deposited. A planarization process, such as a Chemical Mechanical Polish (CMP) process, may be performed to planarize the ILD layer 120. The top surface of the ILD layer 120 is planarized to be coplanar with the top surfaces of the dummy gate structure 114 and the gate spacers 116 to thereby expose the dummy gate structure 114. The planarization may remove the mask layer for patterning the dummy gate structure 114 (and some upper portions of the gate spacers 116 are removed). The top surface of the gate electrode layer 110 of the dummy gate structure 114 is exposed.

Figure 2C:
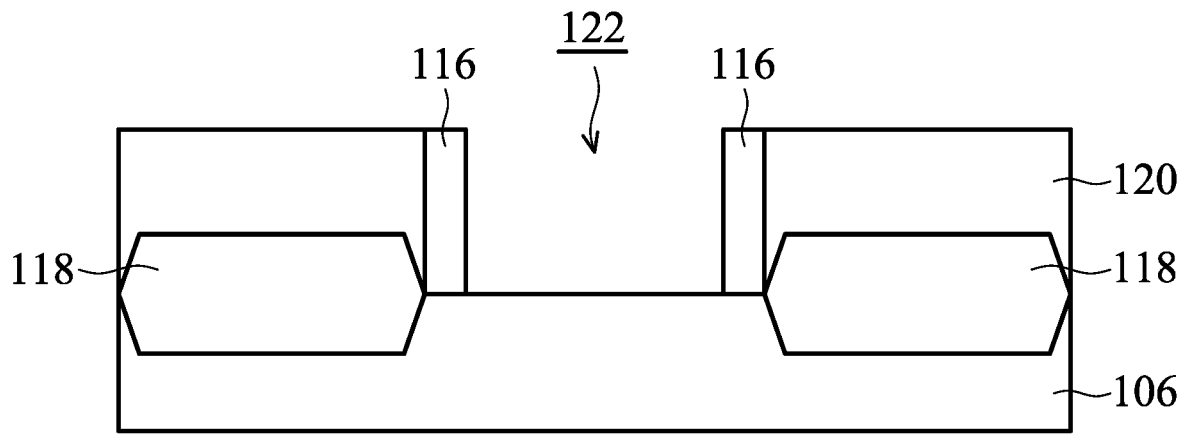

Afterwards, the dummy gate structure 114 is removed to form a recess 122 between the gate spacers 116 and in the ILD layer 120, as shown in FIG. 2C in accordance with some embodiments. The dummy gate electrode layer 110 and the dummy gate dielectric layer 108 are removed, such as by one or more etching processes. The dummy gate electrode layer 110 may be removed by an etching process selective to the material of the dummy gate electrode layer 110, wherein the dummy gate dielectric layer 108 can act as an etch stop layer. Then, the dummy gate dielectric layer 108 can be removed by a different etching process selective to the material of the dummy gate dielectric layer 108. The etching processes can be, for example, a RIE, NBE, a wet etch, or another etching process.

FIG. 2D-2I show cross-sectional views of intermediate structures at several stages of forming a gate structure 140 of a semiconductor device taken along line I-I in FIG. 1, in accordance with some embodiments. The gate structure 140 is formed in the recess 122 where the dummy gate structure 114 is removed through a gate-last process.

Figure 2D:
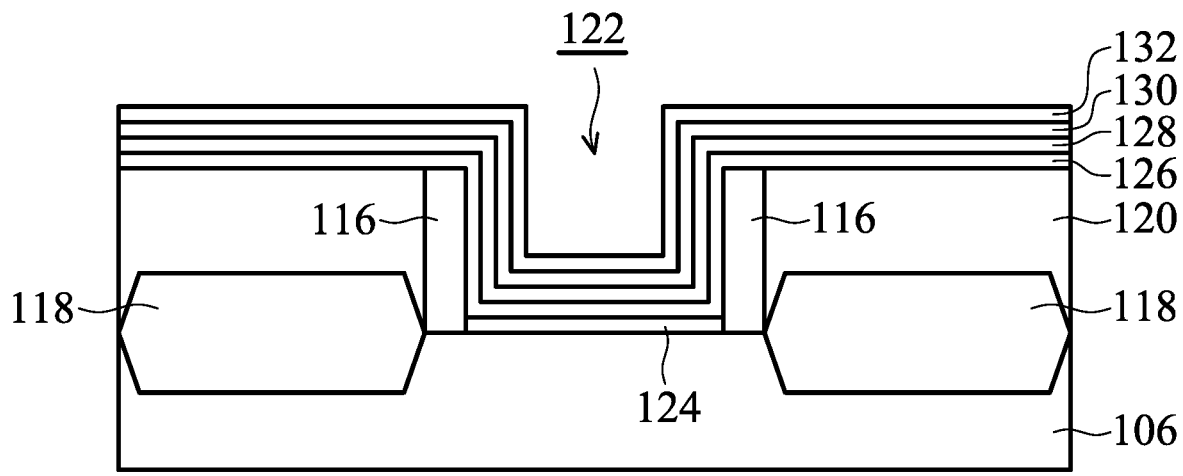

An interfacial layer 124 is formed on the surface of the fin 60 exposed through the recess 122, i.e. the bottom surface of the recess 122 and between the gate spacers 116, as shown in FIG. 2D in accordance with some embodiments. The interfacial layer 124 may be an oxide formed by thermal or chemical oxidation. In some examples, an interfacial layer (not shown) of the dummy gate structure 114 can remain and be in the place of the interfacial layer 124. In some examples, the interfacial layer 124 may be formed from various processing steps, such as being a native oxide formed as a result of a cleaning process. In other examples, the interfacial layer 124 may be omitted.

A gate dielectric layer 126 is conformally deposited in the recess 122 along the sidewalls and the bottom surface of the recess 122, as shown in FIG. 2D in accordance with some embodiments. For example, the gate dielectric layer 126 is deposited over the interfacial layer 124, along the inner sidewalls of the gate spacers 116, and over top surfaces of the gate spacers 116 and the ILD layer 120. The gate dielectric layer 126 includes silicon oxide, silicon nitride, a high-k dielectric material, multilayers thereof, or other dielectric material. The high-k dielectric material may have a k value greater than about 7.0, and may include a metal oxide or a metal silicate of Hf, Al, Zr, La, Mg, Ba, Ti, Pb, or a combination thereof. The gate dielectric layer 126 may be deposited by ALD, PECVD, Molecular-Beam Deposition (MBD), or another deposition technique. In some examples, the gate dielectric layer 126 has a thickness in a range from about 5 Å to about 25 Å.

A capping layer 128 is conformally deposited on the gate dielectric layer 126, as shown in FIG. 2D in accordance with some embodiments. The capping layer 128 includes titanium nitride, titanium-silicon nitride, titanium-carbon nitride, titanium-aluminum nitride, tantalum nitride, tantalum-silicon nitride, tantalum-carbon nitride, aluminum nitride, or a combination thereof. The capping layer 128 may be deposited by ALD, PECVD, MBD, or another deposition technique. In some examples, the capping layer 128 has a thickness in a range from about 5 Å to about 30 Å.

In some examples, several deposited layers for metal gates in different devices may be removed to meet different requirements for the different devices. An etch stop layer 130 is conformally deposited on the capping layer 128, as shown in FIG. 2D in accordance with some embodiments. The etch stop layer 130 includes tantalum nitride, tantalum-silicon nitride, tantalum-carbon nitride, tantalum-aluminum nitride, titanium nitride, titanium-silicon nitride, titanium-carbon nitride, titanium-aluminum nitride, aluminum nitride, or a combination thereof. The etch stop layer 130 may be deposited by ALD, PECVD, MBD, or another deposition technique. In some examples, the etch stop layer 130 has a thickness in a range from about 5 Å to about 30 Å. In addition, the etch stop layer 130 may have a thicker thickness at the bottom of the recess 122 than the thickness thereof on the sidewalls of the recess 122 to provide a better protection during an etching process. For example, the etch stop layer 130 may have a thickness in a range from about 20 Å to about 30 Å at the bottom of the recess 122, and a thickness in a range from about 5 Å to about 15 Å on the sidewalls of the recess 122. Furthermore, the etch stop layer 130 can also be used as a barrier layer.

Next, a first p-type work-function tuning layer 132 is conformally deposited on the etch stop layer 130, as shown in FIG. 2D in accordance with some embodiments. In some embodiments, the first p-type work-function tuning layer 132 is a titanium nitride (TiN) layer deposited using a chloride-based TiN atomic layer deposition (ALD) process and may be referred to as a first chloride-based TiN layer 132. In some examples, the first chloride-based TiN layer 132 may have a thickness in a range from about 5 Å to about 20 Å. The thickness of the first chloride-based TiN layer 132 depends on the desired threshold voltage (Vt) of the device to be formed. In that example, the ALD process for the first chloride-based TiN layer 132 may use an inorganic precursor such as a titanium tetrachloride ($TiCl_4$) precursor and another appropriate precursor, such as ammonia ($NH_3$). The ALD process includes cycles of the titanium tetrachloride ($TiCl_4$) precursor flow, followed by a purge, followed by the other precursor ammonia flow, and followed by a purge.

Figure 2E:
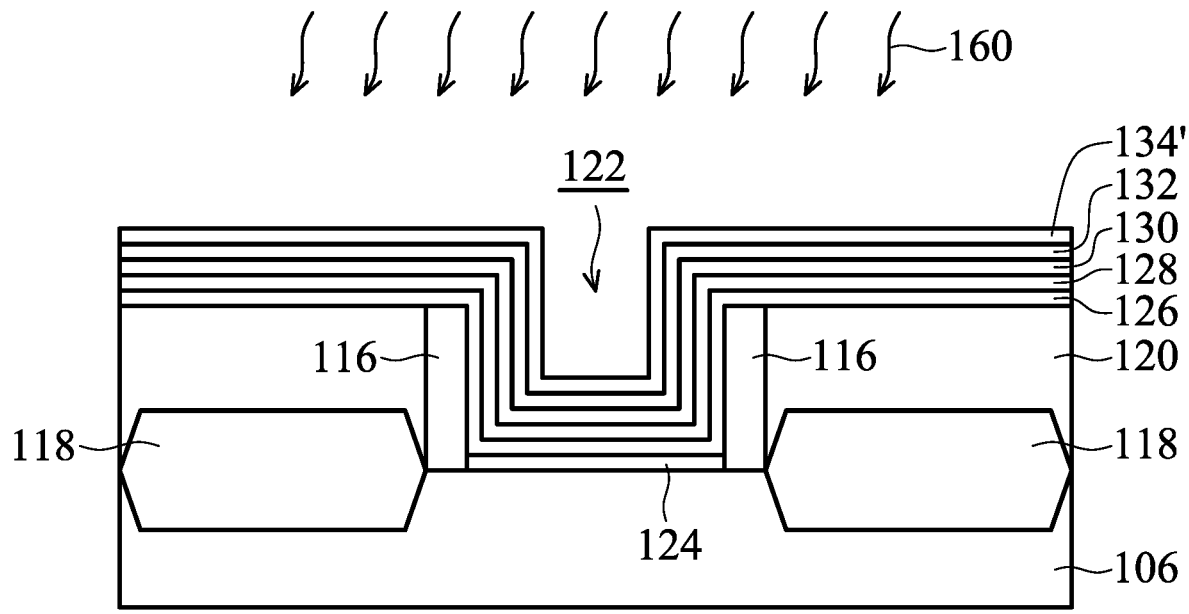

Next, a TiN film 134' is conformally deposited on the first chloride-based TiN layer 132, as shown in FIG. 2E in accordance with some embodiments. The TiN film 134' is deposited using a carbon-based TiN atomic layer deposition (ALD) process. In some embodiments, the ALD process for the TiN film 134' is performed with an organic precursor, such as tetrakis(dimethylamino) titanium (TDMAT), tetrakis (diethylamino) titanium (TDEAT), tetrakis(ethylmethylamino) titanium (TEMAT) or the like. The ALD process for the TiN film 134' may be performed with a nitrogen-containing reactant gas or without a nitrogen-containing reactant gas. The nitrogen-containing reactant gas is for example nitrogen gas ($N_2$) or ammonia ($NH_3$). After the TiN film 134' is deposited, a nitrogen-based plasma treatment 160 is performed on the TiN film 134', as shown in FIG. 2E in accordance with some embodiments. In some embodiments, the nitrogen-based plasma treatment 160 may be performed with $N_2$ or $NH_3$ plasma generated at a power in a range from about 1000 W to about 3000 W. The nitrogen-based plasma treatment 160 can make the surface of the TiN film 134' smooth and can densify the TiN film 134'.

Figure 2F:
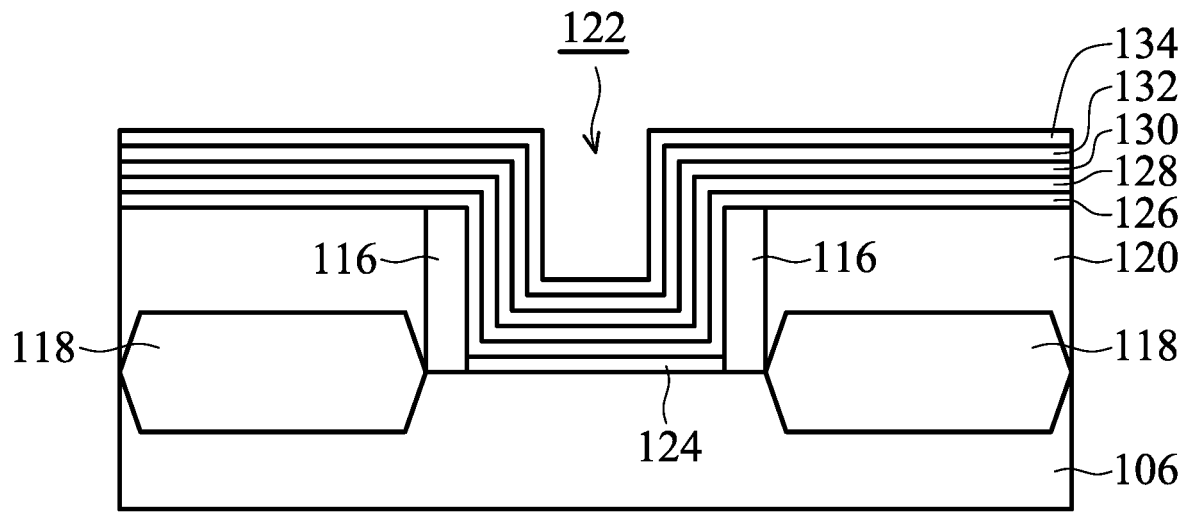

In some embodiments, a second p-type work-function tuning layer 134 is conformally formed on the first chloride-based TiN layer 132, as shown in FIG. 2F in accordance with some embodiments. The second p-type work-function tuning layer 134 is formed by performing cycles of the TiN film 134' deposition followed by the nitrogen-based plasma treatment 160. The second p-type work-function tuning layer 134 is formed using a carbon-based TiN ALD process, and the second p-type work-function tuning layer 134 may be referred to as a carbon-based TiN layer 134. In some embodiments, in one cycle of forming the carbon-based TiN layer 134, the ratio of the number of times of performing the TiN film 134' deposition to the nitrogen-based plasma treatment 160 may be in a range from 1:1 to 1:3, or in a range from 2:1 to 3:1. In some embodiments, in one cycle of forming the carbon-based TiN layer 134, a ratio of the number of times of performing the TiN film 134' deposition to the nitrogen-based plasma treatment 160 may be 1:1, 1:2, 2:5 or 2:1. In some examples, the cycle of forming the carbon-based TiN layer 134 may be performed any number of times, depending on the desired thickness of the carbon-based TiN layer 134 to be formed. In some examples, there may be between 4 cycles and 15 cycles to satisfy the requirement for a step coverage that is greater than 90%, as well as to meet the desired thickness of the carbon-based TiN layer 134. In some examples, the carbon-based TiN layer 134 may have a thickness in a range from about 5 Å to about 20 Å.

In one example, each cycle of forming the carbon-based TiN layer 134 may include performing TiN film 134' deposition one time followed by performing the nitrogen-based plasma treatment 160 one time. The carbon-based TiN layer 134 is formed by repeating this cycle 8 times. In another example, each cycle of forming the carbon-based TiN layer 134 may include performing TiN film 134' deposition two times followed by performing nitrogen-based plasma treatment 160 five times. The carbon-based TiN layer 134 is formed by repeating this cycle 6 times. From the results of measurement and analysis, the thickness and composition of the carbon-based TiN layers formed in the two examples mentioned above are comparable.

Figure 2G:
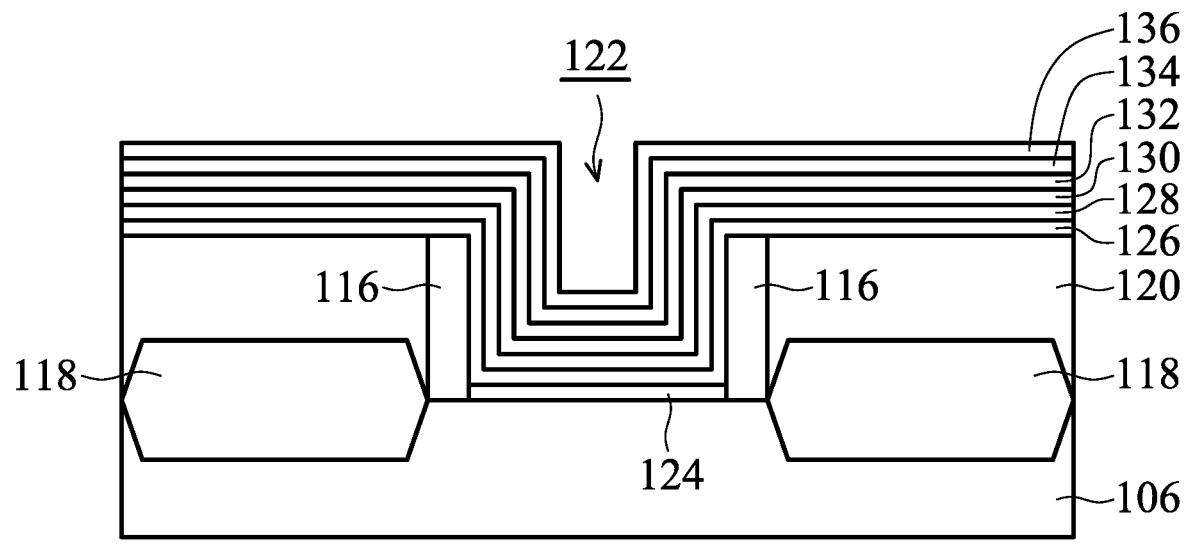

Next, a third p-type work-function tuning layer 136 is conformally deposited on the carbon-based TiN layer 134, as shown in FIG. 2G in accordance with some embodiments. In some examples, the third p-type work-function tuning layer 136 is a TiN layer deposited using a chloride-based TiN ALD process and may be referred to as a second chloride-based TiN layer 136. In some examples, the second chloride-based TiN layer 136 may have a thickness in a range from about 5 Å to about 20 Å. The thickness of the second chloride-based TiN layer 136 depends on the desired threshold voltage (Vt) of the device to be formed. In some embodiments, the ALD process for the second chloride-based TiN layer 136 may be the same as the ALD process for the first chloride-based TiN layer 132. The ALD process for the second chloride-based TiN layer 136 may also use a titanium tetrachloride ($TiCl_4$) precursor and another appropriate precursor, such as ammonia ($NH_3$). The ALD process includes cycles of the titanium tetrachloride ($TiCl_4$) precursor flow, followed by a purge, followed by the ammonia precursor flow, and followed by a purge.

The carbon-based TiN layer 134 has a positive shift in work function while it is compared with the first chloride-based TiN layer 132 and the second chloride-based TiN layer 136 of the same thickness. In some examples, the carbon-based TiN layer 134 has a positive shift of about +111 mV in flat band voltage (Vfb) than the first chloride-based TiN layer 132 and the second chloride-based TiN layer 136 of the same thickness of about 10 Å. Therefore, according to the embodiments of the disclosure, the carbon-based TiN layer 134 can provide a work function tuning for a metal gate close to a p-type FET device such as a p-type FinFET device without increasing the thickness of the work function tuning layer of the metal gate in the p-type FET device. Moreover, multiple threshold voltage (multi-Vt) devices can be obtained through the carbon-based TiN layer to provide a work function tuning close to a p-type metal gate. Therefore, the embodiments of the disclosure allow the fabrication of multi-Vt devices in the same chip or wafer. Moreover, a work function tuning close to a p-type metal gate can be obtained through the carbon-based TiN layer without increasing the thickness of the work function tuning layer. Accordingly, the embodiments make it possible to target multi-Vt devices at process nodes of 16 nm, 10 nm, 7 nm, and beyond.

Figure 2H:
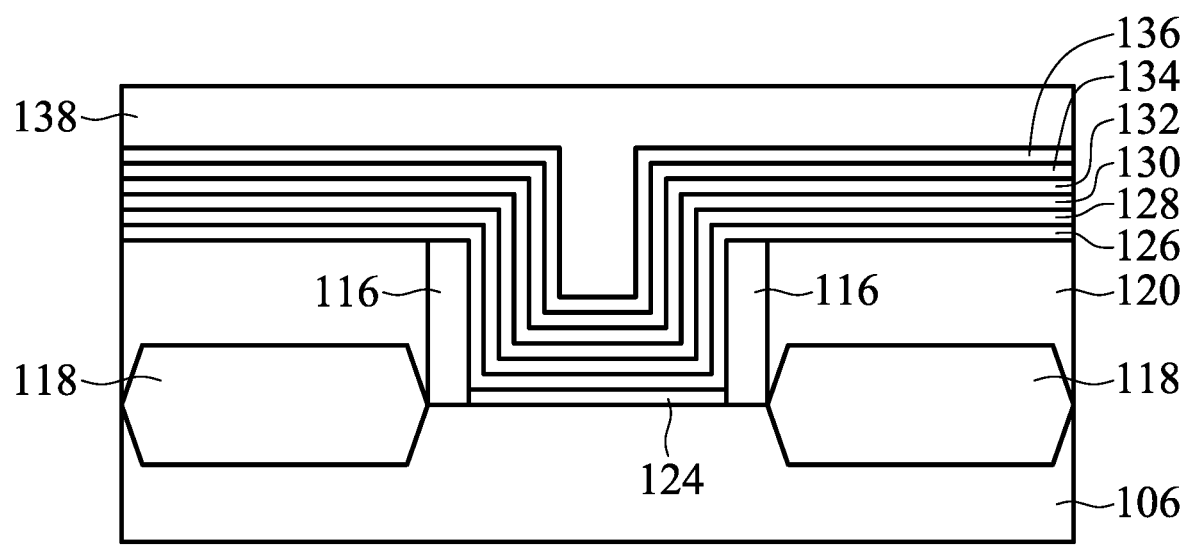

Next, an n-type work function metal layer 138 is deposited on the second chloride-based TiN layer 136 for filling the remaining space of the recess 122, as shown in FIG. 2H in accordance with some embodiments. The n-type work function metal layer 138 may be referred to as an aluminum-containing fill metal layer. In some examples for a PFET device, the n-type work function metal layer 138 may be a titanium aluminide (TiAl) layer deposited using an ALD process. In some examples, the n-type work function metal layer 138 may have a thickness in a range from about 10 Å to about 60 Å. In some other examples, the n-type work function metal layer 138 may include titanium aluminide carbide (TiAlC), tantalum-aluminum carbide, or a combination thereof, and may be deposited by ALD, PECVD, molecular-beam deposition (MBD), or another deposition technique. In some examples, a low resistance metal layer such as a layer of tungsten, copper, aluminum or aluminum copper alloy may be omitted from the metal gate of the PFET device. The low resistance metal layer may be formed on an n-type work function tuning layer of a metal gate in an n-type FET device.

Figure 2I:
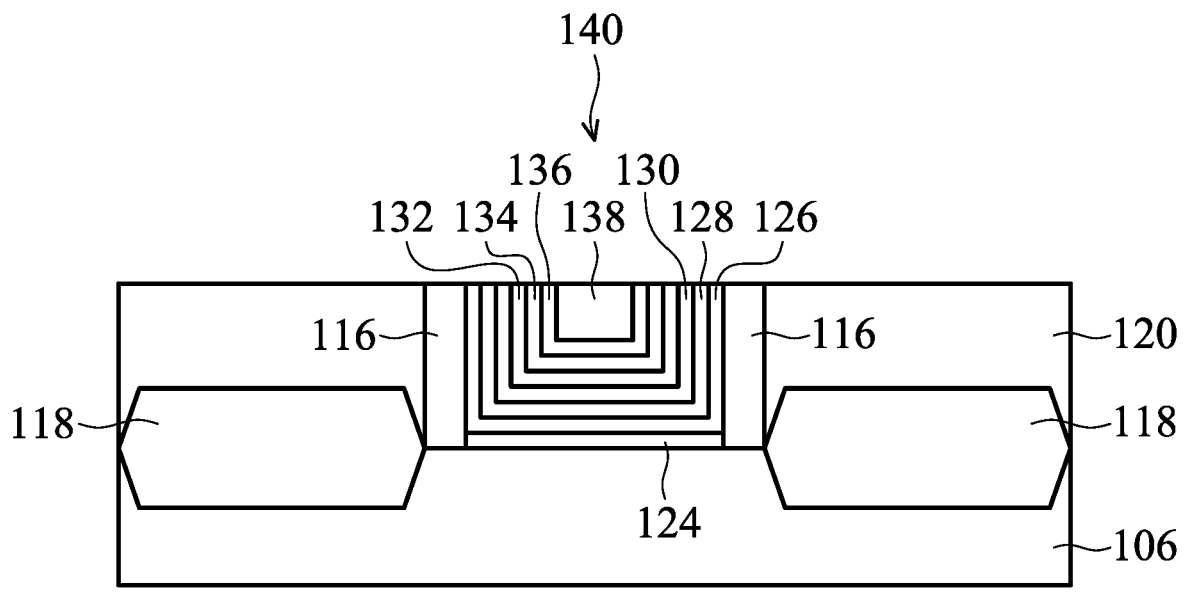

Afterwards, excess portions of the n-type work function metal layer 138, the second chloride-based TiN layer 136, the carbon-based TiN layer 134, the first chloride-based TiN layer 132, the etch stop layer 130, the capping layer 128, and the gate dielectric layer 126 above the top surfaces of the ILD layer 120 and the gate spacers 116 are removed to form a gate structure 140, as shown in FIG. 2I in accordance with some embodiments. The aforementioned excess portions of these layers may be removed with a planarization process, such as a CMP process. After the planarization process, the top surface of the gate structure 140 is coplanar with the top surface of the ILD layer 120. In some embodiments, the gate structure 140 includes the gate dielectric layer 126, the capping layer 128, the etch stop layer 130, the first chloride-based TiN layer 132, the carbon-based TiN layer 134 and the second chloride-based TiN layer 136 which are all U-shaped. The gate structure 140 further includes the n-type work function metal layer 138 as a fill metal. The U-shaped layers mentioned above wrap around the n-type work function metal layer 138 in the gate structure 140.

Figure 2J:
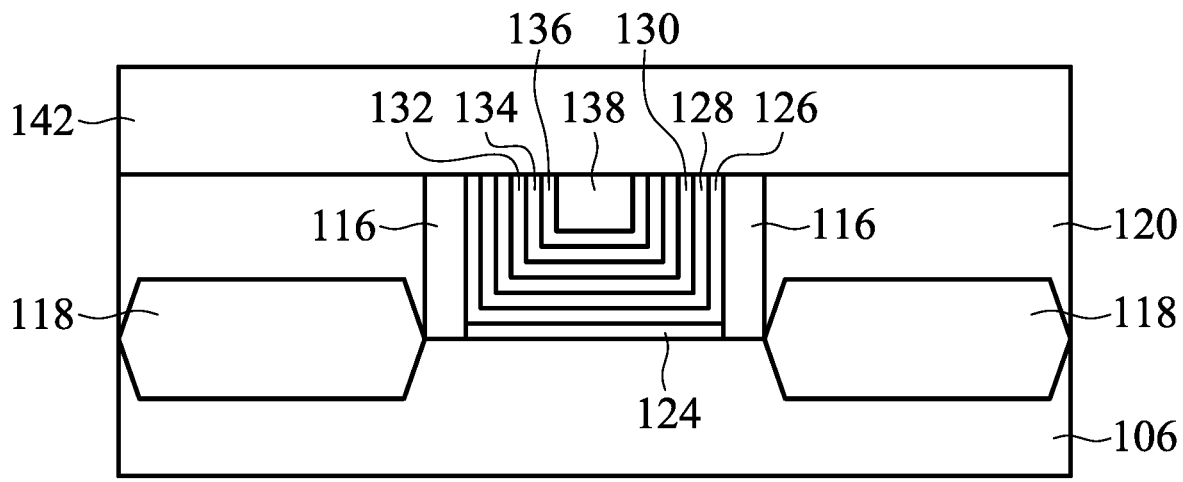

Next, another ILD layer 142 is deposited over the ILD layer 120, the gate structure 140 and the gate spacers 116, as shown in FIG. 2J in accordance with some embodiments. The ILD layer 142 is such as a low-k dielectric layer and includes the same or similar materials of the ILD layer 120. The ILD layer 142 can be deposited using the same or similar techniques described above with respect to the ILD layer 120. After being deposited, the ILD layer 142 is planarized in a CMP process.

Figure 2K:
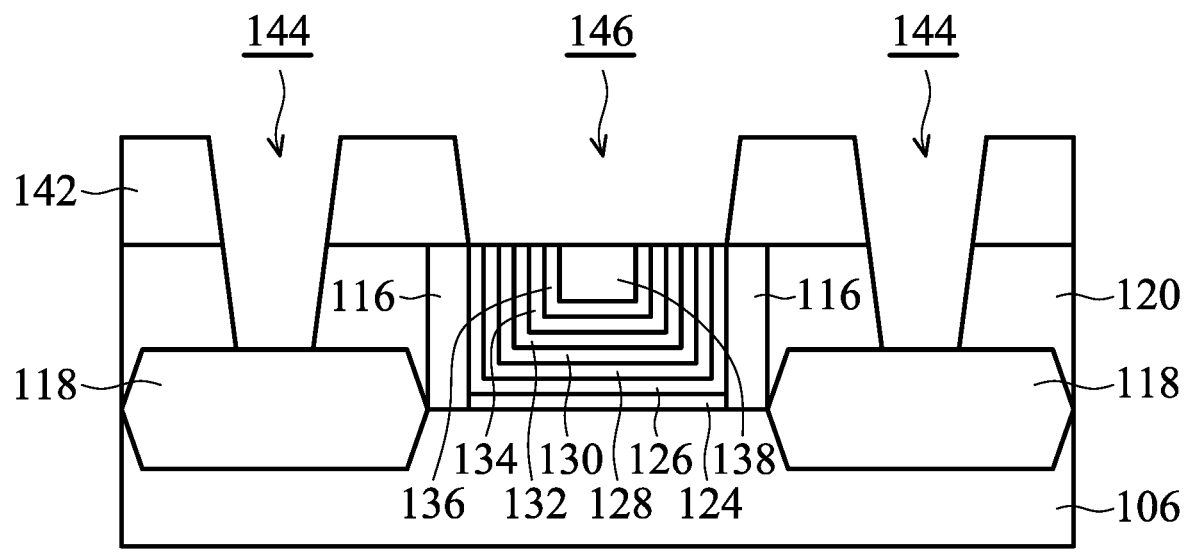

Afterwards, contact holes 144 are formed to pass through the ILD layer 142 and the ILD layer 120, as shown in FIG. 2K in accordance with some embodiments. The epitaxial source/drain regions 118 are exposed through the contact holes 144. Furthermore, another contact hole 146 is formed to pass through the ILD layer 142, as shown in FIG. 2K in accordance with some embodiments. The gate structure 140 is exposed through the contact hole 146. The contact holes 144 and the contact hole 146 may be formed using the appropriate photolithography and etching processes.

Figure 2L:
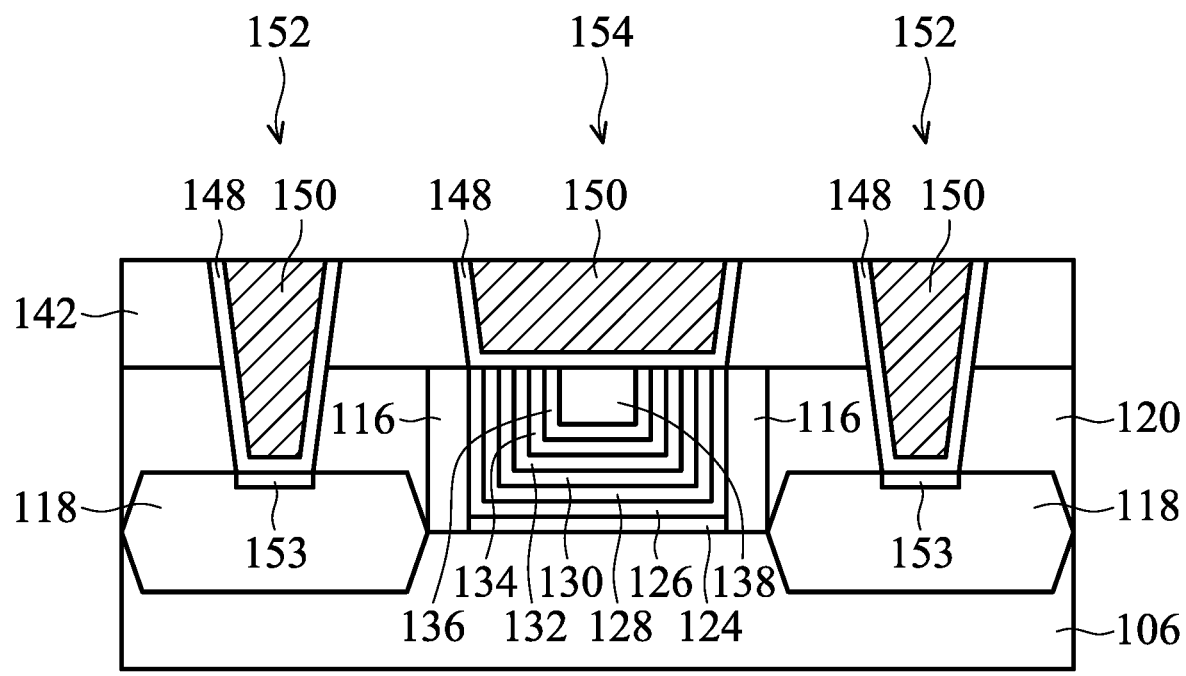

Next, a liner 148 is formed in the contact holes 144 and in the contact hole 146, as shown in FIG. 2L in accordance with some embodiments. The liner 148 is conformally deposited on the sidewalls and the bottom surfaces of the contact holes 144 and the contact hole 146. The liner 148 may be used as a diffusion barrier layer, an adhesion layer, or a combination thereof. The liner 148 may include titanium, titanium nitride, tantalum, tantalum nitride, or the like. The liner 148 may be deposited by ALD, PECVD, MBD, PVD, or another deposition technique. In addition, an anneal process may be performed to facilitate a reaction between some portions of the liner 148 and the epitaxial source/drain regions 118 to form silicide regions 153 at the respective epitaxial source/drain regions 118, as shown in FIG. 2L in accordance with some embodiments.

Afterwards, a conductive material 150 is formed on the liner 148 to fill the contact holes 144 and the contact hole 146. The conductive material 150 includes a metal, such as cobalt, tungsten, copper, aluminum, gold, silver, alloys thereof, or a combination thereof. The conductive material 150 may be deposited by CVD, ALD, PVD, or another deposition technique. A planarization process, such as a CMP process, may be performed to remove excess portions of the conductive material 150 and liner 148 from the top surface of the ILD layer 142 to form source/drain contacts 152 and a gate contact 154, as shown in FIG. 2L in accordance with some embodiments. Each of the source/drain contacts 152 and the gate contact 154 includes the remaining liner 148 and the remaining conductive material 150. The silicide regions 153 can reduce the contact resistance between the epitaxial source/drain region 118 and the source/drain contact 152.

According to the embodiments of the disclosure, the carbon-based TiN layer 134 has a positive shift in work function while it is compared with the first chloride-based TiN layer 132 and the second chloride-based TiN layer 136 of the same thickness. Therefore, using the carbon-based TiN layer as a work function tuning layer can provide a work function tuning close to a p-type metal gate without increasing the thickness of the work function tuning layer in a p-type FET device. Moreover, multiple threshold voltage (multi-Vt) devices in the same chip or wafer can be achieved.

Figure 3A:
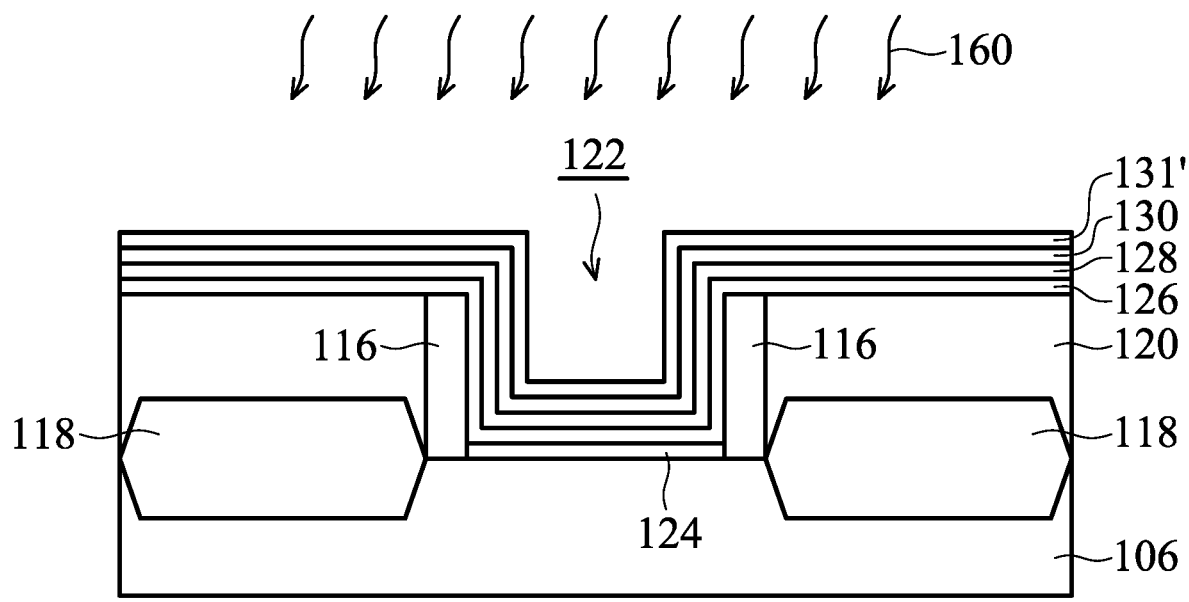
FIGS. 3A-3C show cross-sectional views of intermediate structures at several stages of forming a metal gate of a semiconductor device taken along line I-I in FIG. 1, in accordance with some embodiments.
Figure 3B:
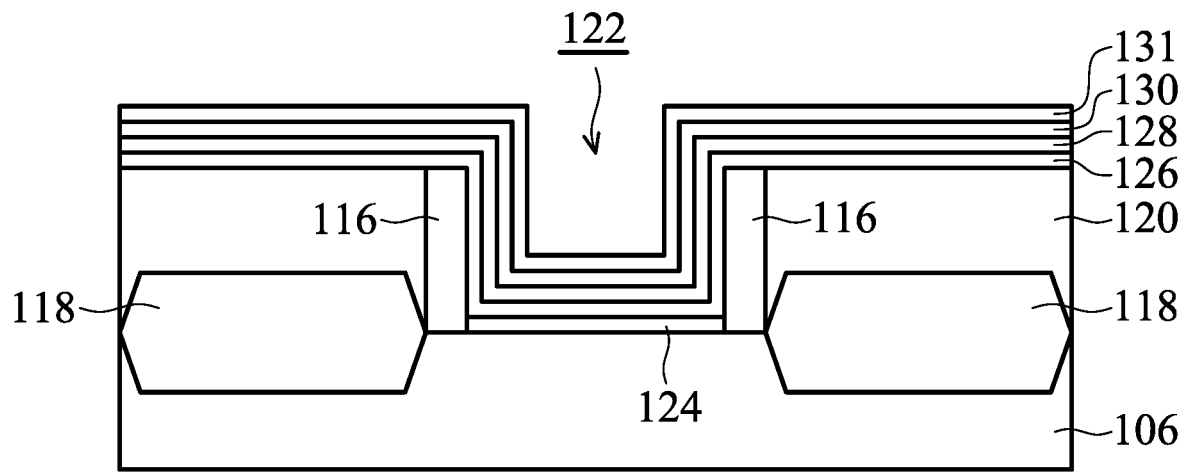
Figure 3C:
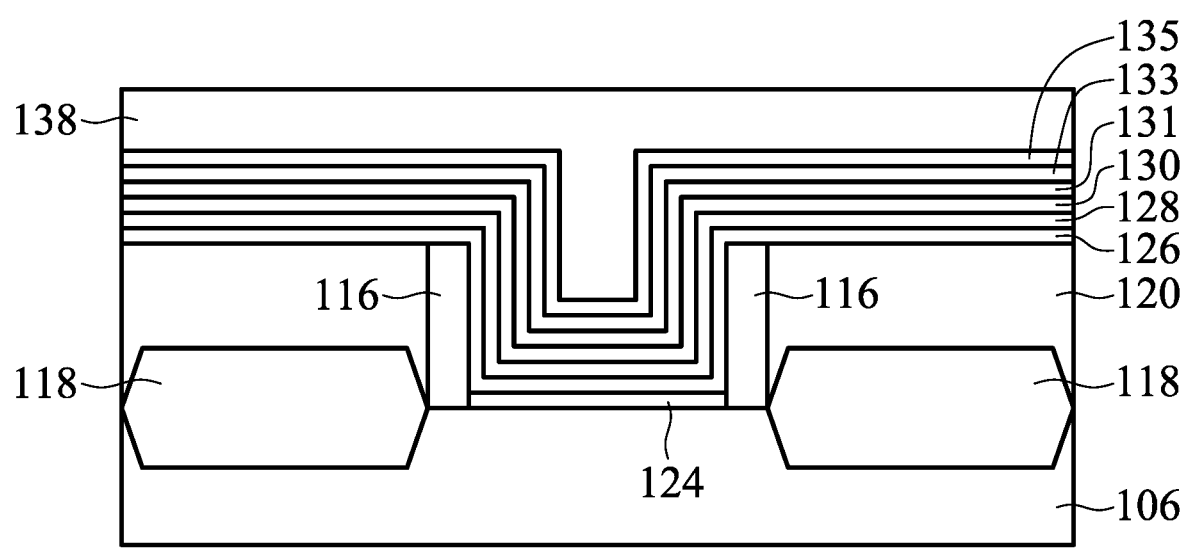

Other embodiments can have various other configurations of the carbon-based TiN layer and the chloride-based TiN layer to achieve the desired threshold voltage of the p-type FET device to be formed. For example, the sequence of depositing the carbon-based TiN layer and the chloride-based TiN layer can be changed. In addition, the relation in thicknesses of the carbon-based TiN layer and the chloride-based TiN layer can also be changed. FIGS. 3A-3C show cross-sectional views of intermediate structures at several stages of forming a metal gate of a semiconductor device taken along line I-I in FIG. 1, in accordance with some embodiments. The structures of FIGS. 3A-3C may be after the etch stop layer 130 of FIG. 2D is deposited and followed by the processes of forming the structures of FIGS. 2I-2L.

After the gate dielectric layer 126, the capping layer 128 and the etch stop layer 130 are conformally deposited in the recess 122 as described above with respect to FIG. 2D, and a TiN film 131' is conformally deposited on the etch stop layer 130, as shown in FIG. 3A in accordance with some embodiments. The TiN film 131' is deposited using a carbon-based TiN ALD process. In that example, the ALD process for the TiN film 131' is performed with an organic precursor such as tetrakis(dimethylamino) titanium (TDMAT), tetrakis(diethylamino) titanium (TDEAT) or tetrakis(ethylmethylamino) titanium (TEMAT). The ALD process for the TiN film 131' may be performed with or without a nitrogen-containing reactant gas, such as $N_2$ or $NH_3$. After the TiN film 131' is deposited, a nitrogen-based plasma treatment 160 is performed on the TiN film 131', as shown in FIG. 3A in accordance with some embodiments. The nitrogen-based plasma treatment 160 may be performed with $N_2$ or $NH_3$ plasma generated at a power in a range from about 1000 W to about 3000 W. The nitrogen-based plasma treatment 160 can make the surface of the TiN film 131' smooth and can densify the TiN film 131'.

As a result, a first p-type work-function tuning layer 131 is conformally formed on the etch stop layer 130, as shown in FIG. 3B in accordance with some embodiments. In some embodiments, the first p-type work-function tuning layer 131 is formed by performing cycles of the TiN film 131' deposition followed by the nitrogen-based plasma treatment 160. The first p-type work-function tuning layer 131 may be referred to as a carbon-based TiN layer 131. In some embodiments, in one cycle of forming the carbon-based TiN layer 131, the ratio of the number of times of performing TiN film 131' deposition to nitrogen-based plasma treatment 160 may be in a range from 1:1 to 1:3, or in a range from 2:1 to 3:1. In some embodiments, in one cycle of forming the carbon-based TiN layer 131, the ratio of the number of times of performing TiN film 131' deposition to nitrogen-based plasma treatment 160 may be 1:1, 1:2, 2:5 or 2:1. In some examples, the cycle of forming the carbon-based TiN layer 131 may be performed any number of times, such as between 4 and 15 cycles, depending on the desired thickness of the carbon-based TiN layer 131 to be formed. In some examples, the carbon-based TiN layer 131 may have a thickness in a range from about 5 Å to about 15 Å.

Next, a second p-type work-function tuning layer 133 is conformally deposited on the carbon-based TiN layer 131, as shown in FIG. 3C in accordance with some embodiments. In some embodiments, the second p-type work-function tuning layer 133 is a TiN layer deposited using a chloride-based TiN ALD process, and may be referred to as a first chloride-based TiN layer 133. The ALD process for the first chloride-based TiN layer 133 may also use a titanium tetrachloride ($TiCl_4$) precursor and another appropriate precursor, such as ammonia ($NH_3$). The ALD process includes cycles of the titanium tetrachloride ($TiCl_4$) precursor flow, followed by a purge, followed by the other precursor ammonia (NH₃) flow, and followed by a purge. In some examples, the first chloride-based TiN layer 133 may have a thickness in a range from about 5 Å to about 15 Å.

Afterwards, a third p-type work-function tuning layer 135 is conformally deposited on the first chloride-based TiN layer 133, as shown in FIG. 3C in accordance with some embodiments. In some embodiments, the third p-type work-function tuning layer 135 is a TiN layer deposited using a chloride-based TiN ALD process and may be referred to as a second chloride-based TiN layer 135. In some examples, the second chloride-based TiN layer 135 may have a thickness in a range from about 5 Å to about 20 Å. The thicknesses of the first chloride-based TiN layer 133 and the second chloride-based TiN layer 135 can depend on the desired threshold voltage (Vt) of the device to be formed. In that example, the ALD process for the second chloride-based TiN layer 135 may be the same as the ALD process for the first chloride-based TiN layer 133.

Next, an n-type work function metal layer 138 is deposited on the second chloride-based TiN layer 135 for filling the remaining space of the recess 122, as shown in FIG. 3C in accordance with some embodiments. In some examples, the material, the deposition process and the thickness of the n-type work function metal layer 138 may be the same as or similar to those as described above with respect to the n-type work function metal layer 138 of FIG. 2H. In some examples for a p-type FET device, the n-type work function metal layer 138 is a titanium aluminide (TiAl) layer deposited using an ALD process. In addition, the following processes after the structure of FIG. 3C may be the same as or similar to those as described above with respect to the structures of FIGS. 2I-2L.

According to the embodiments, the metal gate that includes at least one carbon-based TiN layer can modulate work function close to p-type metal gate for p-type FET devices. Moreover, the carbon-based TiN layer has a positive shift in work function while it is compared with a chloride-based TiN layer of the same thickness. Therefore, the carbon-based TiN layer can provide a work function tuning for the metal gate close to p-type FET devices without increasing the thickness of the work function tuning layer of the metal gate. Accordingly, multiple threshold voltage (multi-Vt) devices can be accommodated in the same chip or wafer at process nodes of 16 nm, 10 nm, 7 nm and beyond through the use of a carbon-based TiN layer with a positive shift in work function.

In addition, from an X-ray diffraction (XRD) analysis, the carbon-based TiN layer has a larger grain size than the chloride-based TiN layer. In some examples, the carbon-based TiN layer has a grain size of about 34.9 Å, and the chloride-based TiN layer has a grain size of about 27.3 Å. The carbon-based TiN layer having a larger grain size can provide less grain boundary than the chloride-based TiN layer. Therefore, the penetration path of an external element in the carbon-based TiN layer is less than that in the chloride-based TiN layer. As a result, aluminum (Al) in the n-type work function metal layer 138 can be blocked by the carbon-based TiN layer from penetrating into the other layers under the carbon-based TiN layer. Accordingly, the carbon-based TiN layer is favorable to p-type PET devices. Furthermore, the carbon-based TiN layer can be not only a work function tuning layer, but also a diffusion barrier layer.

From an X-ray photoelectron spectroscopy (XPS) analysis, the carbon-based TiN layer has carbon-nitrogen (C—N) bond in N spectra, and has carbon-oxygen (C—O) bond and C—N bond in C spectra. The chloride-based TiN layer does not have C—N bond in N spectra, and does not have C—O bond and C—N bond in C spectra. As shown in the XPS analysis, the carbon-based TiN layer contains carbon and the chloride-based TiN layer does not contain carbon. Therefore, the carbon-based TiN layer and the chloride-based TiN layer have different compositions to provide different effects for metal-gate work-function tuning.

From a secondary ion mass spectrometry (SIMS) analysis, the carbon-based TiN layer has less oxygen (O) and more nitrogen (N) contents than those in the chloride-based TiN layer. Accordingly, the carbon-based TiN layer is suitable for p-type band-edge metal gate of p-type FET devices. In addition, according to the SIMS analysis, the Al content drops significantly in p-type work function tuning layers that have a carbon-based TiN layer, compared to p-type work function tuning layers with a chloride-based TiN layer to replace the carbon-based TiN layer. Accordingly, the carbon-based TiN layer has an Al-blocking capability that is favorable to p-type work function tuning.

As the semiconductor industry has progressed into nanometer process nodes, the space available for filling various layers of a metal gate in FET devices, specifically p-type FET devices, has become smaller and smaller. According to the benefits mentioned above, the embodiments of the disclosure are suitable for semiconductor devices at process node of 7 nm (N7), N5, N3 and beyond.

According to the embodiments, using a carbon-based TiN layer 134 or 131 to replace a chloride-based TiN layer for use as the work function tuning layer of a metal gate has a positive shift in work function close to a p-type band-edge metal gate without increasing the thickness of the work function tuning layer. The carbon-based TiN layer 134 or 134 is formed by cycles of a TiN film 134' or 131' deposition using a carbon-based TiN ALD process followed by a nitrogen-based plasma treatment 160. The nitrogen-based plasma treatment 160 can make the density of the carbon-based TiN layer 134 or 131 higher than that of the chloride-based TiN layers 132, 133, 135 and 136. Moreover, the carbon-based TiN layer 134 or 131 has lower oxygen and higher nitrogen contents than those of the chloride-based TiN layers 132, 133, 135 and 136 of the same thickness. Also, the carbon-based TiN layer 134 or 131 has a larger grain size than the chloride-based TiN layers 132, 133, 135 and 136. As a result, the carbon-based TiN layer 134 or 131 can block Al in the n-type work function metal layer 138 and prevent Al from penetrating into the gate dielectric layer 126 and the interfacial layer 124. Accordingly, threshold voltage (Vt) tuning close to PFET band edge can be achieved by the carbon-based TiN layer 134 or 131 for targeting multi-Vt devices in the same chip or wafer without increasing the thickness of p-type work function tuning layer.

In addition, various other configurations of the carbon-based TiN layers 134, 131 and the chloride-based TiN layers 132, 133, 135, 136 can be used. In some embodiments, the carbon-based TiN layer 134 is interpolated between the chloride-based TiN layers 132 and 136. In some embodiments, the carbon-based TiN layer 134 may be disposed as an outer work-function tuning layer or an inner work-function tuning layer. In addition, any different number of carbon-based TiN layers and chloride-based TiN layers having various thicknesses may be used to achieve the desired performance of the semiconductor devices to be formed.

In some embodiments, a method of fabricating a semiconductor device is provided. The method includes forming a gate dielectric layer over a substrate. The method also includes depositing a first p-type work function tuning layer over the gate dielectric layer using a first atomic layer deposition (ALD) process with an inorganic precursor. The method further includes forming a second p-type work function tuning layer on the first p-type work function tuning layer using a second atomic layer deposition (ALD) process with an organic precursor. In addition, the method includes forming an n-type work function metal layer over the second p-type work function tuning layer.

In some embodiments, a method of fabricating a semiconductor device is provided. The method includes forming a dummy gate structure on a fin that protrudes from a semiconductor substrate, forming an interlayer dielectric layer over the fin and surrounding the dummy gate structure, and removing the dummy gate structure to form a recess in the interlayer dielectric layer. The method also includes depositing a gate dielectric layer conformally on sidewalls and the bottom surface of the recess, and depositing a first titanium nitride (TiN) layer conformally over the gate dielectric layer using a chloride-based TiN atomic layer deposition (ALD) process. The method further includes forming a second titanium nitride (TiN) layer conformally on the first TiN layer using a carbon-based TiN atomic layer deposition (ALD) process, and forming an aluminum-containing fill metal layer over the second TiN layer for filling the recess to form a replacement gate structure. In addition, the method includes forming a source region and a drain region in the fin and on opposite sides of the replacement gate structure.

In some embodiments, a semiconductor device is provided. The semiconductor device includes a fin protruding from a semiconductor substrate, a gate structure over the fin, and a source region and a drain region in the fin and on opposite sides of the gate structure. In the semiconductor device, the gate structure includes a gate dielectric layer on sidewalls and the top surface of the fin. The gate structure also includes a first titanium nitride (TiN) layer over the gate dielectric layer. The gate structure further includes a second titanium nitride (TiN) layer on the first TiN layer, wherein the second TiN layer contains carbon, and the second TiN layer has a work function that is higher than a work function of the first TiN layer. In addition, the gate structure includes an aluminum-containing fill metal layer over the second TiN layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, comprising:
    forming a gate dielectric layer over a substrate;
    depositing a first p-type work function tuning layer over the gate dielectric layer using a first atomic layer deposition (ALD) process with an inorganic precursor;
    forming a second p-type work function tuning layer on the first p-type work function tuning layer using a second atomic layer deposition (ALD) process with an organic precursor; and
    forming an n-type work function metal layer over the second p-type work function tuning layer.

2. The method as claimed in claim 1, wherein the second p-type work function tuning layer comprises a titanium nitride (TiN) layer, and the organic precursor used in the second ALD process comprises tetrakis(dimethylamino) titanium (TDMAT), tetrakis(diethylamino) titanium (TDEAT) or tetrakis(ethylmethylamino) titanium (TEMAT).

3. The method as claimed in claim 1, wherein the formation of the second p-type work function tuning layer further comprises a nitrogen-based plasma treatment after performing the second atomic layer deposition (ALD) process.

4. The method as claimed in claim 3, wherein a ratio of a number of times of performing the second atomic layer deposition (ALD) process to the nitrogen-based plasma treatment comprises 1:1, 1:2, 2:5 or 2:1.

5. The method as claimed in claim 3, wherein the nitrogen-based plasma treatment is performed with $N_2$ or $NH_3$ plasma generated at a power in a range from about 1000 W to about 3000 W.

6. The method as claimed in claim 1, further comprising depositing a third p-type work function tuning layer on the second p-type work function tuning layer using the first ALD process with the inorganic precursor.

7. The method as claimed in claim 6, wherein the first p-type work function tuning layer and the third p-type work function tuning layer comprise a titanium nitride (TiN) layer and the inorganic precursor used in the first ALD process comprises titanium tetrachloride ($TiCl_4$).

8. The method as claimed in claim 1, wherein the n-type work function metal layer comprises titanium aluminide (TiAl).

9. The method as claimed in claim 1, wherein the second p-type work function tuning layer has a work function that is higher than a work function of the first p-type work function tuning layer.

10. A method of fabricating a semiconductor device, comprising:
    forming a dummy gate structure on a fin that protrudes from a semiconductor substrate;
    forming an interlayer dielectric layer over the fin and surrounding the dummy gate structure;
    removing the dummy gate structure to form a recess in the interlayer dielectric layer;
    depositing a gate dielectric layer conformally on sidewalls and a bottom surface of the recess;
    depositing a first titanium nitride (TiN) layer conformally over the gate dielectric layer using a chloride-based TiN atomic layer deposition (ALD) process;
    forming a second titanium nitride (TiN) layer conformally on the first TiN layer using a carbon-based TiN atomic layer deposition (ALD) process;
    forming an aluminum-containing fill metal layer over the second TiN layer for filling the recess to form a replacement gate structure; and
    forming a source region and a drain region in the fin and on opposite sides of the replacement gate structure.

11. The method as claimed in claim 10, wherein the carbon-based TiN ALD process is performed with an organic precursor, and the organic precursor comprises tetrakis(dimethylamino) titanium (TDMAT), tetrakis(diethylamino) titanium (TDEAT) or tetrakis(ethylmethylamino) titanium (TEMAT).

12. The method as claimed in claim 10, wherein the formation of the second TiN layer further comprises a nitrogen-based plasma treatment after performing the carbon-based TiN ALD process.

13. The method as claimed in claim 12, wherein the nitrogen-base plasma treatment is performed with $N_2$ or $NH_3$ plasma generated at a power in a range from about 1000 W to about 3000 W.

14. The method as claimed in claim 12, wherein a ratio of a number of times of performing the carbon-based TiN ALD process to the nitrogen-base plasma treatment is in a range from 1:1 to 1:3, or in a range from 2:1 to 3:1.

15. The method as claimed in claim 10, wherein the chloride-based TiN ALD process is performed with titanium tetrachloride ($TiCl_4$) and ammonia ($NH_3$).

16. A method of fabricating a semiconductor device, comprising:
 forming a gate dielectric layer on a substrate;
 forming a first p-type work function tuning layer on the gate dielectric layer, wherein the first p-type work function tuning layer comprises chlorine;
 forming a second p-type work function tuning layer on the first p-type work function tuning layer, wherein the second p-type work function tuning layer comprises carbon, and the second p-type work function tuning layer has a work function that is higher than a work function of the first p-type work function tuning layer; and
 forming an n-type work function metal layer on the second p-type work function tuning layer.

17. The method as claimed in claim 16, wherein the second p-type work function tuning layer has a grain size that is larger than a grain size of the first p-type work function tuning layer.

18. The method as claimed in claim 16, further comprising:
 forming a third p-type work function tuning layer on the second p-type work function tuning layer, wherein the third p-type work function tuning layer comprises chlorine.

19. The method as claimed in claim 18, wherein the work function of the second p-type work function tuning layer is higher than a work function of the third p-type work function tuning layer.

20. The method as claimed in claim 18, wherein the second p-type work function tuning layer has a grain size that is larger than a grain size of the first p-type work function tuning layer and a grain size of the third p-type work function tuning layer.

* * * * *